United States Patent [19]

Schoofs et al.

[11] Patent Number: 4,712,091

[45] Date of Patent: Dec. 8, 1987

[54] DIGITAL/ANALOG CONVERTER HAVING A SWITCHABLE REFERENCE CURRENT

[75] Inventors: Franciscus A. C. M. Schoofs; Martinus P. M. Bierhoff; Job F. P. Van Mil; Albert H. Slomp, all of Eindhoven, Netherlands

[73] Assignee: U.S. Philips Corporation, New York, N.Y.

[21] Appl. No.: 811,237

[22] Filed: Dec. 20, 1985

[30] Foreign Application Priority Data

Jan. 16, 1985 [NL] Netherlands ..................... 8500086

[51] Int. Cl.$^4$ ............................................. H03M 1/70
[52] U.S. Cl. ............................. 340/347 DA; 323/312; 323/317; 340/347 M
[58] Field of Search .... 340/347 DA, 347 M, 347 CC; 323/312, 315-317

[56] References Cited

U.S. PATENT DOCUMENTS 3,940,760  2/1976  Brokaw ..................... 340/347 DA

OTHER PUBLICATIONS

The Engineering Staff of Analog Devices, Inc., Analog-Digital Conversion Handbook, 6/1972, pp. I-53 to I-59.

Primary Examiner—T. J. Sloyan
Attorney, Agent, or Firm—Robert T. Mayer; Bernard Franzblau

[57] ABSTRACT

A D/A converter providing a binary weighted series of currents ($I_3$, $I_4$, $I_5$) via first current-source transistors ($T_3$, $T_4$, $T_5$) each in a given ratio to a reference current ($I_1$) in a reference transistor ($T_1$). The weighted currents are switched to analog output (15) or to positive supply terminal (20) via first switching devices (3.1, 3.2, 3.3). A control device includes a second current-source transistor ($T_8$) connected to a reference-current source or to the positive supply terminal via a second switching device (4). The current ($I_8$) in the transistor $T_8$ has a given ratio to the reference current ($I_1$). By connecting the second current-source transistor to the positive supply terminal or to the reference current source, the reference transistor carries the full reference current ($I_{ref}$) from the reference current source or only a fraction of the full reference current, respectively. As the weighted currents are in a given ratio to the current ($I_1$) in the reference transistor, these currents are a similar fraction smaller in the first case than in the second case. By increasing the reference transistor current ($I_1$) stepwise from a fraction to the full reference current over the range of the digital input code, the converter output current range will also vary stepwise.

9 Claims, 3 Drawing Figures

DIGITAL/ANALOG CONVERTER HAVING A SWITCHABLE REFERENCE CURRENT

BACKGROUND OF THE INVENTION

This invention relates to a digital-to-analog converter for converting a digital input code into an analog output current, comprising:
- reference current source for supplying a reference current,
- a reference transistor which is coupled to the reference current source,
- a plurality of first current source transistors having bases coupled to the base of the reference transistor and whose collector-emitter currents are each in a given ratio to the collector-emitter current in the reference transistor, and
- a plurality of first switching devices equal in number to the plurality of first current-source transistors, which switching devices each switch the current from an associated current-source transistor to a summing point at which the analog output current is obtained, or to a point of constant potential, depending on the digital input code.

Such a digital-to-analog converter is suitable for various purposes and may be used in particular for controlling the "radial" motor in a compact-disc player.

A digital-to-analog converter of this type is known from, for example, U.S. Pat. No. 3,940,760. In the converter described therein the output currents of the current-source transistors constitute a binary-weighted series of currents which currents are each in a given ratio to the current from the reference transistor. This transistor receives a reference current from a reference current source. By means of negative feedback between the collector and the base the base voltage is controlled in such a way that the collector current of the reference transistor is substantially equal to the reference current. The number of current-source transistors required depends on the ratio between the smallest and the largest current to be supplied by the digital-to-analog converter. The output currents of the current-source transistors are applied to the output of the digital-to-analog converter or drained to a point of fixed potential by means of switches which are controlled by the digital input code.

A disadvantage of this known digital-to-analog converter is that if it has to supply mainly comparatively small output currents, the output currents of the current-source transistors, which supply the comparatively large currents, are drained to the point of fixed potential, which results in a substantial power dissipation.

This situation occurs in, for example, a compact-disc player. In this player a laser unit, by means of which a compact disc is read, is mounted on an arm which is moved over the compact disc along a radial arc by means of a motor. The control current for this motor is supplied by a digital-to-analog converter. When the spiral track on a compact disc is read, a relatively small control current is needed for this motor. However, for rapidly jumping from one track to another track on the compact disc, the motor demands a comparatively large control current. Since normal tracking is the situation which occurs most frequently, the digital-to-analog converter has to supply only a small current most of the time.

SUMMARY OF THE INVENTION

Therefore, it is an object of the invention to provide a digital-to-analog converter which has a smaller power dissipation than the known digital-to-analog converter for the same range of output currents.

According to the invention a digital-to-analog converter of the type specified in the opening paragraph is characterized in that the digital-to-analog converter comprises a control device which causes the collector-emitter current in the reference transistor to increase in steps from a fraction of to substantially the full reference current from the reference current source, between a first value of the digital input code, corresponding to the minimum analog output current, and a second value of the digital input code corresponding to the maximum analog output current.

The invention is based on the recognition of the following fact. Since the output currents of the current-source transistors are in a fixed ratio to the current in the reference transistor, these output currents are a similar fraction smaller when the current in the reference transistor is a fraction of the reference current than in the case when the reference transistor carries the full reference current. By increasing the current in the reference transistor stepwise over the entire range of the digital input code, the range of the output current of the digital-to-analog converter is also increased stepwise. As the current-source transistors only supply currents corresponding to a specific sub-range, the currents in the next higher sub-ranges need no longer be generated and therefore need not be drained. Thus, the power dissipation is substantially reduced and the efficiency of the digital-to-analog converter is increased accordingly.

An embodiment of the invention is characterized in that for each step the control device comprises a second current-source transistor, whose base is coupled to the base of the reference transistor and whose current is in a given ratio to the current in the reference transistor. The control device further comprises a second switching device for each second current-source transistor, which switching device connects the associated second current-source transistor to the reference current source or to a point of fixed potential. If a second current-source transistor is coupled to the reference-current source it drains a part of the reference current, so that the current in the reference transistor is only a fraction of the reference current. By stepwise reducing the number of second current-source transistors coupled to the reference transistor, the current in the reference transistor increases stepwise to the full reference current.

If a second current-source transistor is not coupled to the reference-current source, its output current can be drained to the power supply. A further improvement in the efficiency of the digital-to-analog converter may be obtained if, in accordance with a further embodiment of the invention, it is characterized in that the second switching device of at least one second current-source transistor connects the relevant second current-source transistor to the reference-current source or to a first current-source transistor.

BRIEF DESCRIPTION OF THE DRAWINGS

Embodiments of the invention will now be described in more detail, by way of example, with reference to the accompanying drawings, in which:

FIG. 1 shows a digital-to-analog converter in accordance with a first embodiment of the invention by means of which the inventive principle will be explained. The digital-to-analog converter comprises a reference-current source 2 which supplies a reference current $I_{ref}$. A reference transistor $T_1$ has its emitter connected to the negative power-supply terminal 10. Between the collector and the base of the transistor $T_1$ negative feedback is provided by means of the base-emitter junction of a transistor $T_2$, whose collector is connected to the positive power-supply terminal 20. By means of this negative feedback the base-emitter voltage of the transistor $T_1$ is controlled so as to make the collector current equal to the current $I_1$ applied to this transistor. The digital-to-analog converter further comprises a plurality of first current-source transistors $T_3$, $T_4$ and $T_5$, whose base-emitter paths are connected in parallel with the base-emitter path of the transistor $T_1$. The emitter areas of these transistors are scaled in accordance with a binary series and the emitter area of the transistor $T_3$ is equal to that of the transistor $T_1$. The currents $I_3$, $I_4$ and $I_5$ from the transistors $T_3$, $T_4$ and $T_5$ are then equal to $I_1$, $2I_1$ and $4I_1$, respectively. The output current $I_3$ of the current-source transistor $T_3$ is applied to a switching device 3.1, which comprises two transistors $T_{6.1}$ and $T_{7.1}$, arranged as a differential pair. The collector of the transistor $T_{7.1}$ is connected to the output 15 of the digital-to-analog converter and the collector of the transistor $T_{6.1}$ is connected to the positive power-supply terminal 20. The current source transistors $T_4$ and $T_5$ are connected to the switches 3.2 and 3.3 respectively, comprising transistors $T_{6.2}$, $T_{7.2}$ and transistors $T_{6.3}$, $T_{7.3}$ in the same way as the switch 3.1. The base of the transistors $T_{7.1}$, $T_{7.2}$ and $T_{7.3}$ are connected to a terminal 14, which is at a reference voltage. The bases of the transistors $T_{6.1}$, $T_{6.2}$ and $T_{6.3}$ are connected to the inputs 11, 12 and 13. The bits of the digital input signal are applied to these inputs. If the voltage on an input corresponding to the one bit value is higher than the reference voltage on the terminal 14, the output current of the relevant current-source transistor is drained to the positive power-supply terminal 20, and, if the voltage corresponding to the other bit-value is smaller than the reference voltage on the terminal 14, the output current of the relevant current-source transistor is switched to the output of the digital-to-analog converter.

Figure 1:
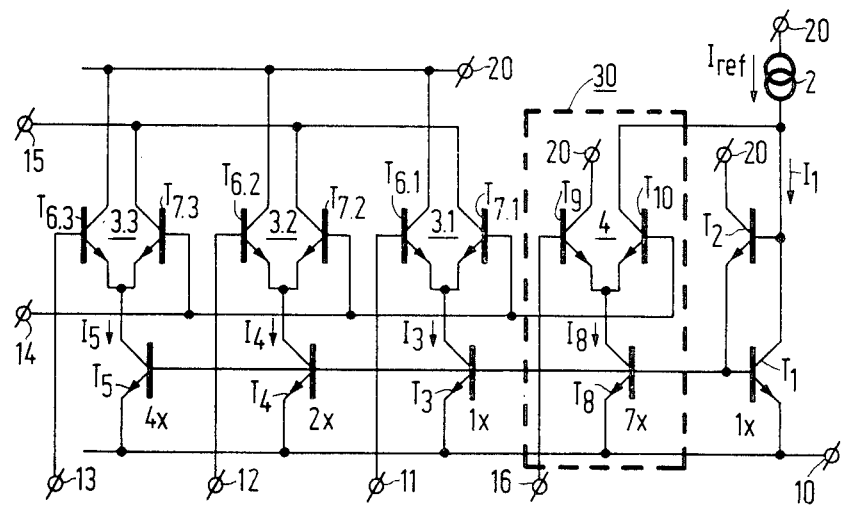
FIG. 1 shows a digital-to-analog converter in accordance with a first embodiment of the invention.

The digital-to-analog converter further comprises a control device 30, which comprises a second current-source transistor $T_8$ having a base-emitter junction connected in parallel with that of the transistor $T_1$. The emitter area of the transistor $T_8$ is in a ratio of 7:1 to that of the transistor $T_1$ so that the output current of $T_8$ is equal to $7I_1$. The transistor $T_8$ is connected to a switch 4 which comprises a differential pair composed of transistors $T_9$ and $T_{10}$. The base of the transistor $T_{10}$ is connected to the reference input 14 and the base of the transistor $T_9$ is connected to a control input 16 and the collector of transistor $T_9$ is connected to the positive power-supply terminal 20. The collector of the transistor $T_{10}$ is connected to the reference current source 2.

The circuit operates as follows. The control signal for the input 16 of the control device 30 is derived from the digital input word by means of a logic circuit, not shown. If the three most-significant bits of a digital input word are zero the logic circuit generates a control signal for the input 16. This control signal is low relative to the reference voltage on the base of the transistor $T_{10}$. In this case the three least significant bits of the digital input word are applied to the inputs 11 to 13. If one of the three most significant bits becomes a one, the logic circuit generates a control signal for the input 16 which is high relative to the reference voltage on the base of the transistor $T_{10}$. The three most significant bits of the digital input word are then applied to the inputs 11 to 13. If the control signal on the input 16 of the control device 30 is low relative to the reference voltage on the base of the transistor $T_{10}$, the collector of the transistor $T_8$ is connected to the reference-current source 2. The current $I_8 = 7I_1$ is then taken from the reference-current source 2 so that the reference transistor $T_1$ carries a current $I_1 = \frac{1}{8}I_{ref}$. The output currents of the current-source transistors $T_3$, $T_4$ and $T_5$ are then $I_3 = \frac{1}{8}I_{ref}$, $I_4 = 2/8I_{ref}$ and $I_5 = 4/8I_{ref}$, respectively. The output current of the digital-to-analog converter can thus increase from 0 to $\frac{7}{8}I_{ref}$ in steps of $\frac{1}{8}I_{ref}$. If the control signal on the input 16 is high relative to the reference voltage on the base of the transistor $T_{10}$, the current $I_8$ is drained to the positive power-supply terminal 20 via the transistor $T_9$. The reference transistor $T_1$ then carries a current $I_1 = I_{ref}$. The output currents of the current-source transistors $T_3$, $T_4$ and $T_5$ are then equal to $I_3 = I_{ref}$, $I_4 = 2I_{ref}$ and $I_5 = 4I_{ref}$, respectively. The output current of the digital-to-analog converter can then increase from 0 to $7I_{ref}$ in steps of $I_{ref}$. As in the range from 0 to $\frac{7}{8}I_{ref}$ the currents in the range from $I_{ref}$ to $7I_{ref}$ are not generated and are not dissipated without being used, the efficiency of the converter is improved substantially.

Figure 2:
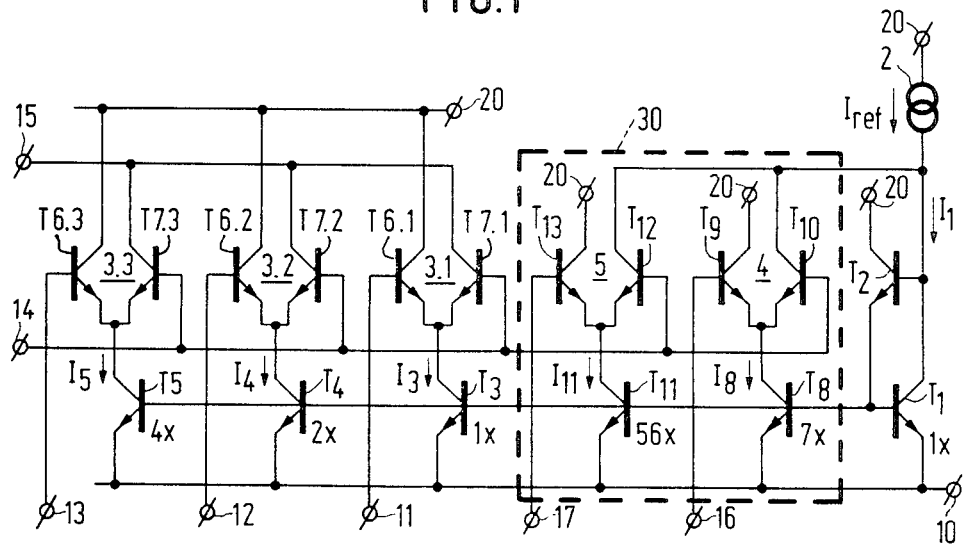
FIG. 2 shows a digital-to-analog converter in accordance with a second embodiment of the invention.

A digital-to-analog converter in accordance with a second embodiment will be described with reference to FIG. 2, in which parts performing the same functions bear the same reference numerals as in FIG. 1. The converter differs from that in FIG. 1 in that the control device 30 comprises a second current-source transistor $T_{11}$, whose base-emitter junction is connected in parallel with that of the transistor $T_1$ in addition to the current-source transistor $T_8$. The emitter area of the transistor $T_{11}$ is in a ratio of 56:1 to that of the transistor $T_1$ so that the output current of this transistor is $I_{11} = 56I_1$. By means of a switch 5 comprising the transistors $T_{12}$ and $T_{13}$ the transistor $T_{11}$ can be connected to the positive power-supply terminal 20 if the voltage on the control input 17 is higher than the reference voltage on the base of the transistor $T_{12}$ and it can be connected to the reference current source 2 if the voltage on the control input 17 is lower than the reference voltage on the base of 12. By means of this digital-to-analog converter the output current range is increased in three steps. If the current-source transistors $T_8$ and $T_{11}$ are connected to the reference-current source 2 the current in the reference transistor $T_1$ will be $I_1 = 1/64\ I_{ref}$. The output currents of the transistors $T_3$, $T_4$ and $T_5$ are then $I_3 = 1/64I_{ref}$, $I_4 = 2/64I_{ref}$ and $I_5 = 4/64I_{ref}$, respectively. The output current range of the converter then varies from 0 to $7/64I_{ref}$ in steps of $1/64I_{ref}$. If only the current-source transistor $T_8$ is connected to the reference-current source 2, the transistor $T_1$ will carry a current $I_1 = \frac{1}{8}I_{ref}$ and if the currents $I_8$ and $I_{11}$ are both drained to the positive power-supply terminal 20, the current in the transistor $T_1$ will be $I_1 = I_{ref}$. The output current range is then as described for the converter shown in FIG. 1.

Figure 3:
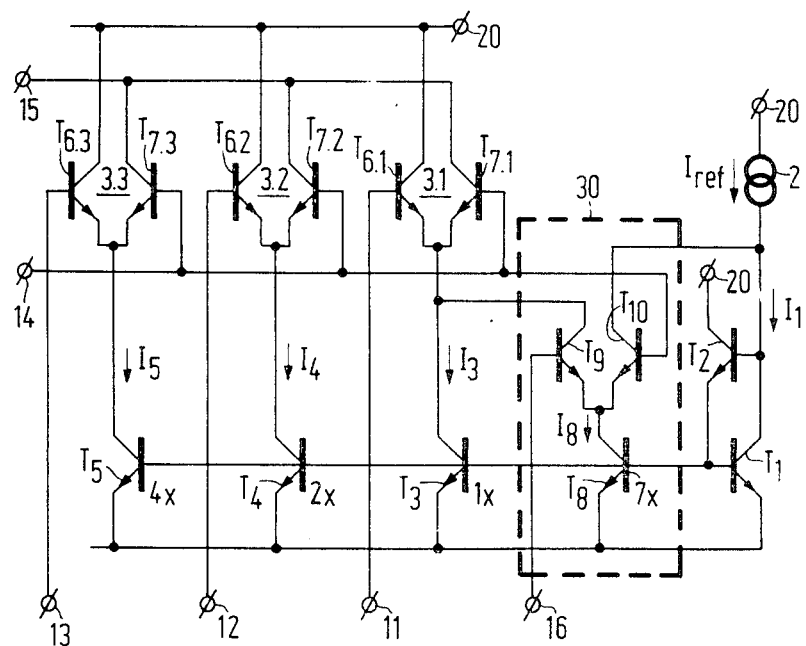
FIG. 3 shows a digital-to-analog converter in accordance with a third embodiment of the invention.

A digital-to-analog converter in accordance with a third embodiment will now be described with reference to FIG. 3, in which parts performing the same functions bear the same reference numerals as in FIG. 1. The converter differs from that shown in FIG. 1 in that the current $I_8$ from the transistor $T_8$ is not transferred to the positive power-supply terminal 20 but to the output of the current source transistor $T_3$ via the transistor $T_9$. If the current-source transistor $T_8$ is connected to the reference-current source 2 via the transistor $T_{10}$, the current in the reference transistor $T_1$ will be $I_1 = \frac{1}{8}I_{ref}$, so that the output current range of the converter again varies from 0 to $\frac{7}{8}I_{ref}$ in steps of $\frac{1}{8}I_{ref}$. If the current source transistor $T_8$ is connected to the transistor $T_3$ via the transistor $T_9$, the transistor $T_1$ will carry the full reference current $I_{ref}$. A total current of $8I_{ref}$ will then be applied to the switch 3.1. The output current of the converter can then increase from $2I_{ref}$ to $14I_{ref}$ in steps of $2I_{ref}$. As the current $I_8$ from the current source transistor $T_8$ is no longer drained to the positive power-supply terminal 20 if this transistor $T_8$ is not connected to the reference current source 2, the efficiency of the converter is increased even further.

The invention is not limited to the embodiments described above. For example, the ratio between the currents in the current-source transistors and the reference transistor can also be adjusted by means of resistors arranged in the emitter lines of these transistors. Alternatively, the emitters of the first current-source transistors may be connected to an R-2R network. Further, the switches by means of which the currents from the current-source transistors are switched may be constructed in various other ways. Moreover, the feedback between the collector and the base of the transistor $T_1$ by means of the transistor $T_2$ can also be obtained in another manner, for example by means of an operational amplifier.

What is claimed is:

1. A digital-to-analog converter for converting a digital input code into an analog output current, comprising:
    a reference-current source for supplying a reference current,
    a reference transistor coupled to the reference current source,
    a plurality of first current source transistors coupled to the reference transistor so that the respective collector-emitter currents thereof are each in a given ratio to the collector-emitter current in the reference transistor,
    a plurality of first switching devices equal in number to and individually coupled to the plurality of first current-source transistors so that the switching devices each switch a current from an associated current-source transistor to a summing point at which the analog output current is obtained, or to a point of constant potential, depending on the digital input code applied to respective switching inputs of the switching devices, and
    a control device which controls the collector-emitter current in the reference transistor to increase in steps from a fraction of to substantially the full reference current from the reference current source, between a first value of the digital input code corresponding to the minimum analog output current, and a second value of the digital input code corresponding to the maximum analog output current.

2. A digital-to-analog converter as claimed in claim 1, wherein for each step the control device comprises: a second current-source transistor having a base coupled to a base of the reference transistor and whose current is in a given ratio to the current in the reference transistor, and a respective second switching device coupled to each second current-source transistor to selectively connect the associated second current-source transistor to the reference current source or to a point of fixed potential.

3. A digital-to-analog converter as claimed in claim 1, wherein for each step the control device comprises: a second current-source transistor having a base coupled to a base of the reference transistor and whose current is in a given ratio to the current in the reference transistor, and a respective second switching device coupled to each second current-source transistor to selectively connect the associated second current-source transistor to the reference current source or to one of the first current-source transistors.

4. A digital-to-analog converter for converting a digital input signal having n-bits into an analog output current, comprising:
    a reference-current source for supplying a reference current,
    a reference transistor coupled to the reference current source,
    a plurality of m first current source transistors for generating m output currents each in a given ratio to the current in the reference transistor,
    a plurality of m first switching devices for switching the output currents of associated first current-source transistors to a summing point at which the analog output current is obtained or to a point of constant potential, depending on the value of a bit of the digital input signal applied to a respective switching input of the switching device, and
    a control device for increasing the current through the reference transistor in a number of k steps from a fraction of to substantially the full reference current from the reference current source, between a first value of the digital input signal corresponding to the minimum analog output current, and a second value of the digital input signal corresponding to the maximum output current,
    the number of m first current sources being equal to $m = n/(k+1)$, and
    for subsequent values of the current through the reference transistor each time m more significant bits of the n-bits digital input signal are applied to the switching inputs of the switching devices.

5. A D/A converter for converting a digital input signal into an analog output current at an output of the converter, comprising:
    a reference transistor,
    a reference current source coupled to the reference transistor to supply a current thereto,
    a plurality of first current source transistors coupled to the reference transistor so that the currents in said first transistors are in a given weighted ratio pattern relative to the current in the reference transistor, a plurality of first switching devices having respective switching input terminals for receiving the digital input signal, means individually coupling the first switching devices to respective ones of the current source transistors so that the switching devices switch currents from respective coupled current source transistors to said converter output or to a point of constant potential as a function of the digital input signal applied to said switching input terminals, and a control device coupled to said reference transistor and to said reference current source and having a control input which controls the control device to adjust the current in the reference transistor in steps determined by the digital input signal thereby to stepwise adjust the output current range of the converter.

6. A D/A converter as claimed in claim 5 wherein the control device comprises:

at least one second current source transistor coupled to the reference transistor so that current in said second current source transistor is in a given ratio to the current in the reference transistor, and a second switching device coupled to the second current source transistor, to the reference current source and to one of the first current source transistors, said control input of the control device controlling the second switching device so as to couple the second current source transistor to the reference current source or to said one of the first current source transistors as a function of a signal at said control input.

7. A D/A converter as claimed in claim 5 wherein the control device comprises:

at least one second current source transistor coupled to the reference transistor so that current in said second current source transistor is in a given ratio to the current in the reference transistor, and a second switching device coupled to the second current source transistor, to the reference current source and to a point of constant potential, said control input of the control device controlling the second switching device so as to couple the second current source transistor to the reference current source or to said point of constant potential as a function of a signal at said control input.

8. A D/A converter as claimed in claim 7 wherein said second switching device comprises first and second transistors and first means coupling the first transistor in a first series circuit with the second current source transistor to said point of constant potential and second means coupling the second transistor in a second series circuit with the second current source transistor to the reference current source, wherein said control input is coupled to a control electrode of one of said first and second transistors, and third means coupling a control electrode of the other one of said first and second transistors to a point of reference voltage.

9. A D/A converter as claimed in claim 6 wherein the digital input signal comprises a given number of bits and said plurality of first current-source transistors is fewer in number than said given number of bits of the digital input signal, whereby for each step of the current in the reference transistor a number of bits of the digital input signal equal to the number of current-source transistors is supplied to the switching input terminals of the first switching devices.

* * * * *